(12) United States Patent
Chao et al.

(10) Patent No.: US 11,189,564 B2
(45) Date of Patent: Nov. 30, 2021

(54) METAL-OXIDE-SEMICONDUCTOR FIELD-EFFECT-TRANSISTORS (MOSFET) AS ANTIFUSE ELEMENTS

(71) Applicant: Intel Corporation, Santa Clara, CA (US)

(72) Inventors: Yu-Lin Chao, Portland, OR (US); Sarvesh H. Kulkarni, Hillsboro, OR (US); Vincent E. Dorgan, Hillsboro, OR (US); Uddalak Bhattacharya, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 729 days.

(21) Appl. No.: 15/943,541

(22) Filed: Apr. 2, 2018

(65) Prior Publication Data
US 2019/0304907 A1 Oct. 3, 2019

(51) Int. Cl.
*H01L 23/525* (2006.01)
*H01L 29/78* (2006.01)
*H01L 27/112* (2006.01)
*H01L 27/02* (2006.01)

(52) U.S. Cl.
CPC ...... *H01L 23/5252* (2013.01); *H01L 27/0251* (2013.01); *H01L 27/11206* (2013.01); *H01L 29/7833* (2013.01)

(58) Field of Classification Search
CPC ....... H01L 23/50; H01L 23/481; H01L 29/51; H01L 21/82; H01L 23/5228; H01L 23/5252; H01L 23/49866; H01L 27/11206; G11C 17/165; G11C 17/16; G11C 17/18
See application file for complete search history.

(56) References Cited

U.S. PATENT DOCUMENTS 10,490,438 B2 * 11/2019 Tomino ............. H01L 21/76224
2016/0336332 A1 * 11/2016 Lee ................... H01L 27/11206

\* cited by examiner

*Primary Examiner* — Karen Kusumakar
*Assistant Examiner* — Adam S Bowen
(74) *Attorney, Agent, or Firm* — Schwabe, Williamson & Wyatt, P.C.

(57) ABSTRACT

Embodiments herein may describe techniques for an integrated circuit including a MOSFET having a source area, a channel area, a gate electrode, and a drain area. The channel area may include a first channel region with a dopant of a first concentration next to the source area, and a second channel region with the dopant of a second concentration higher than the first concentration next to the drain area. A source electrode may be in contact with the source area, a gate oxide layer above the channel area, and the gate electrode above the gate oxide layer. A first resistance exists between the source electrode and the gate electrode. A second resistance exists between the source electrode, the gate electrode, and a path through the gate oxide layer to couple the source electrode and the gate electrode after a programming operation is performed. Other embodiments may be described and/or claimed.

25 Claims, 7 Drawing Sheets

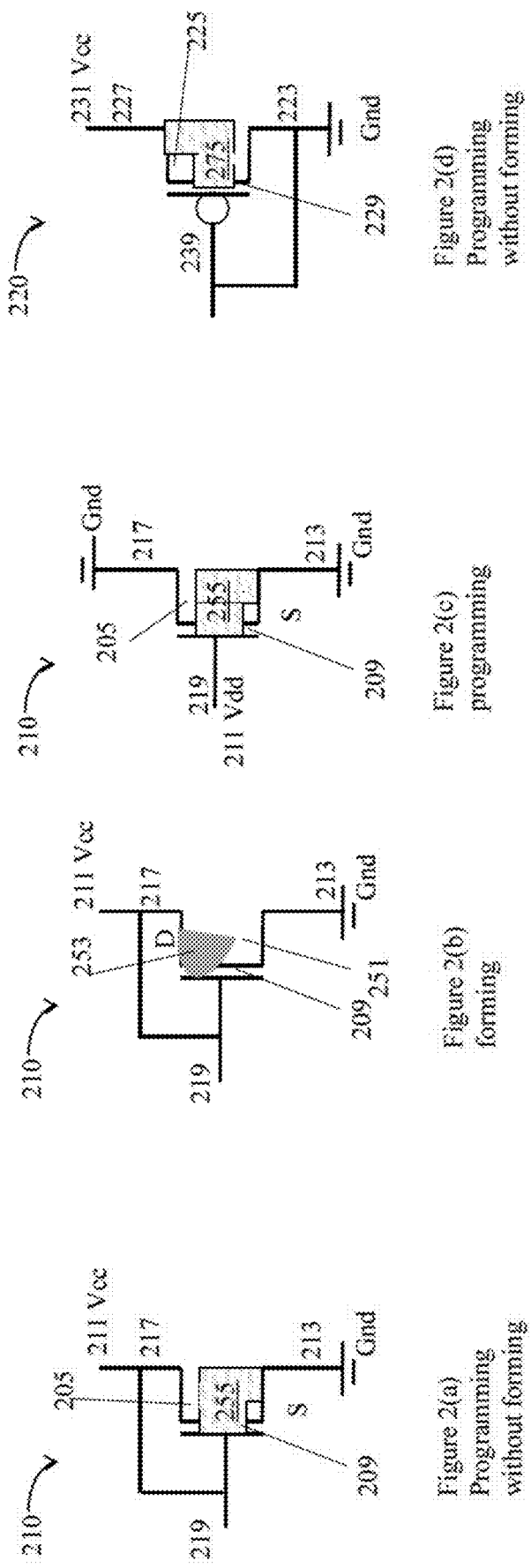

METAL-OXIDE-SEMICONDUCTOR FIELD-EFFECT-TRANSISTORS (MOSFET) AS ANTIFUSE ELEMENTS

FIELD

Embodiments of the present disclosure generally relate to the field of integrated circuits, and more particularly, to antifuse elements and memory arrays.

BACKGROUND

An integrated circuit (IC) may include many components, e.g., transistors, resistors, capacitors, diodes, formed on a semiconductor substrate. In addition, ICs may often include one or more types of memory arrays formed by multiple memory cells, such as a CMOS memory array including multiple memory cells, an antifuse memory array including multiple antifuse elements, or a fuse memory array including multiple fuse elements. In electronics and electrical engineering, a fuse element may be an electrical safety device that operates to provide overcurrent protection of an electrical circuit. Normally, a fuse element may include a copper wire, strip, or interconnect, which may melt or break down when too much current flows through it, thereby interrupting the current. A fuse element with a copper wire may melt at a high current, and may create a void space in the fuse element after the copper wire has been melted, which may post security risks. In addition, a fuse memory array including multiple fuse elements with copper wire may occupy a large area.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 2(a)-2(d) schematically illustrate diagrams of MOSFETs to be used as an antifuse element having a path through a gate oxide layer to couple a source electrode and a gate electrode, in accordance with some embodiments.

DETAILED DESCRIPTION

Figure 1A:
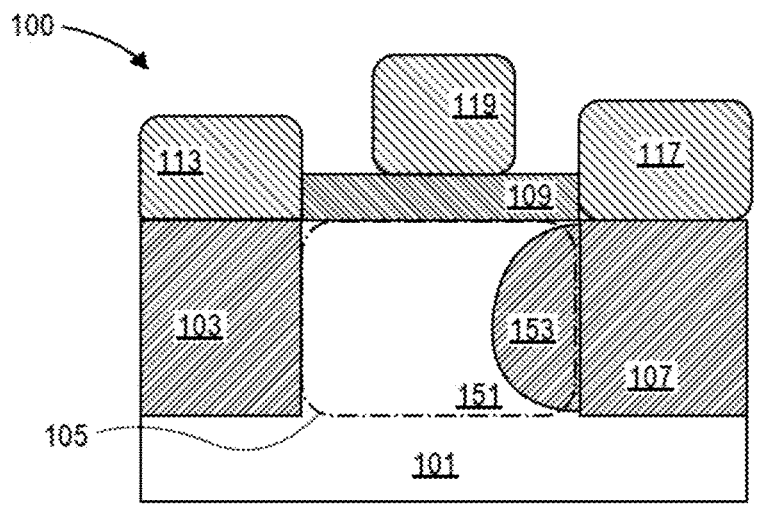
FIGS. 1(a)-1(c) schematically illustrate diagrams of a metal-oxide-semiconductor field-effect-transistor (MOSFET) to be used as an antifuse element having a path through a gate oxide layer to couple a source electrode and a gate electrode after a programming operation is performed, in accordance with some embodiments.

A fuse element may be an electrical safety device that operates to provide overcurrent protection of an electrical circuit. Conventionally, a fuse element may include a copper interconnect. A copper interconnect of a fuse element may melt at a high current, e.g., around 10 milliamps (mA) to 30 mA, when a high voltage, e.g., 5 voltage, is applied to the fuse element. After the copper interconnect of the fuse element has been melted, the fuse element may include a void space that was occupied by the copper interconnect before it has been melted. Such a void space may be detectable by top-down imaging techniques, hence making the fuse element vulnerable for security reasons. In addition, a fuse memory array including multiple fuse elements having copper interconnects may occupy a large area.

An antifuse element may be an electrical device that performs operations opposite to a fuse element. Whereas a fuse element starts with a low resistance and may permanently break an electrically conductive path (typically when the current through the path exceeds a specified limit), an antifuse element starts with a high resistance and may permanently create an electrically conductive path (typically when the voltage across the antifuse element exceeds a certain level). A memory array may be formed by including multiple antifuse elements, or multiple fuse elements.

Hot carrier injection may usually refer to an effect in a metal-oxide-semiconductor field-effect-transistor (MOSFET), where a carrier is injected from the conducting channel area in the substrate to a gate dielectric layer or a gate oxide layer above the channel area. Hot carrier injection may not be desirable for a normal MOSFET operation since it may lead to hot carrier degradation effects for the MOSFET, such as threshold voltage changes due to occupied traps in the gate dielectric layer. Embodiments herein may exploit the hot carrier effect in a MOSFET to behave like an antifuse element. In detail, embodiments may use channel engineering to introduce defects at a destined location, e.g., close to the drain area of a MOSFET. The so formed MOSFET may create a path through a gate oxide layer to couple a source electrode and a gate electrode after a programming operation is performed on the MOSFET. A first resistance may exist between the source electrode and the gate electrode of the MOSFET. A second resistance may exist between the source electrode, the gate electrode, and the path through the gate oxide layer to couple the source electrode and the gate electrode. The path may be formed after a programming operation is performed, and the path may be caused by the hot carrier injection due to an uneven doping in the channel area. As a result, the first resistance is about 102 to 106 times larger than the second resistance. The two different resistances may be used to represent a digital 0 and a digital 1 respectively. After a programming operation is performed on the MOSFET to form a path through a gate oxide layer to couple the source electrode and the gate electrode, no void space is created within the MOSFET. Therefore an antifuse element including the MOSFET may be safer compared to a fuse element including a copper interconnect.

Embodiments herein may present an integrated circuit (IC) including a source electrode in contact with a source area on a substrate, a drain electrode in contact with a drain area on the substrate, and a channel area including a first channel region next to the source area, and a second channel region next to the drain area. The first channel region may include a dopant of a first concentration, and the second channel region may include the dopant of a second concentration higher than the first concentration. The IC may further include a gate oxide layer above the channel area, and a gate electrode above the gate oxide layer. The source area, the channel area, the gate electrode, and the drain area may form a MOSFET. A first resistance may exist between the source electrode and the gate electrode. A programming operation may be performed when a programming voltage is applied to the gate electrode and the source electrode is coupled to a ground voltage to generate a current between the source electrode, the gate oxide layer, and the gate electrode. After the programming operation, a path may be generated through the gate oxide layer to couple the source electrode and the gate electrode. A second resistance may exist between the source electrode, the gate electrode, and the path through the gate oxide layer to couple the source electrode and the gate electrode.

Embodiments herein may present a method for forming an IC. The method may include: forming a source area on a substrate, and a drain area on the substrate; forming a channel area including a first channel region next to the source area, wherein the first channel region includes a dopant of a first concentration; and forming a second channel region of the channel area next to the drain area, wherein the second channel region includes the dopant of a second concentration higher than the first concentration. The method may further include forming a gate oxide layer above the channel area; and forming a gate electrode above the channel area and above the substrate, a source electrode in contact with the source area, and a drain electrode in contact with the drain area. The source area, the channel area, the gate electrode, and the drain area may form a MOSFET. A first resistance may exist between the source electrode and the gate electrode. A programming operation may be performed when a programming voltage is applied to the gate electrode and the source electrode is coupled to a ground voltage to generate a current between the source electrode, the gate oxide layer, and the gate electrode. After the programming operation, a path may be generated through the gate oxide layer to couple the source electrode and the gate electrode. A second resistance may exist between the source electrode, the gate electrode, and the path through the gate oxide layer to couple the source electrode and the gate electrode.

Embodiments herein may present a computing device including a circuit board and an antifuse memory array coupled to the circuit board. The antifuse memory array may include a plurality of antifuse cells. An antifuse cell of the plurality of antifuse cells may include an antifuse element coupled to a first selector and a second selector. The antifuse element may include a source electrode in contact with a source area on a substrate and coupled to a source line of the antifuse memory array through the first selector, and a drain electrode in contact with a drain area on the substrate and coupled to a word line of the antifuse memory array through the second selector. In addition, the antifuse element may include a channel area including a first channel region next to the source area, and a second channel region next to the drain area. The first channel region may include a dopant of a first concentration, and the second channel region may include the dopant of a second concentration higher than the first concentration. The antifuse element may further include a gate oxide layer above the channel area, and a gate electrode above the gate oxide layer and coupled to a bit line of the antifuse memory array. The source area, the channel area, the gate electrode, and the drain area may form a MOSFET. A first resistance may exist between the source electrode and the gate electrode. A programming operation may be performed when a programming voltage is applied to the gate electrode and the source electrode is coupled to a ground voltage to generate a current between the source electrode, the gate oxide layer, and the gate electrode. After the programming operation, a path may be generated through the gate oxide layer to couple the source electrode and the gate electrode. A second resistance may exist between the source electrode, the gate electrode, and the path through the gate oxide layer to couple the source electrode and the gate electrode.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
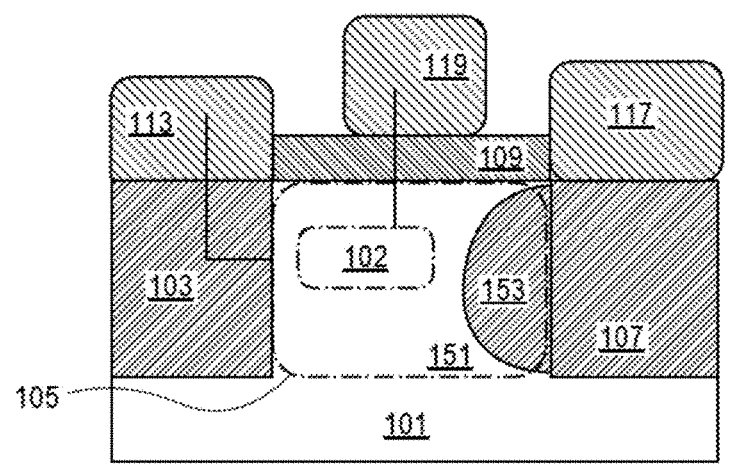
Figure 1C:
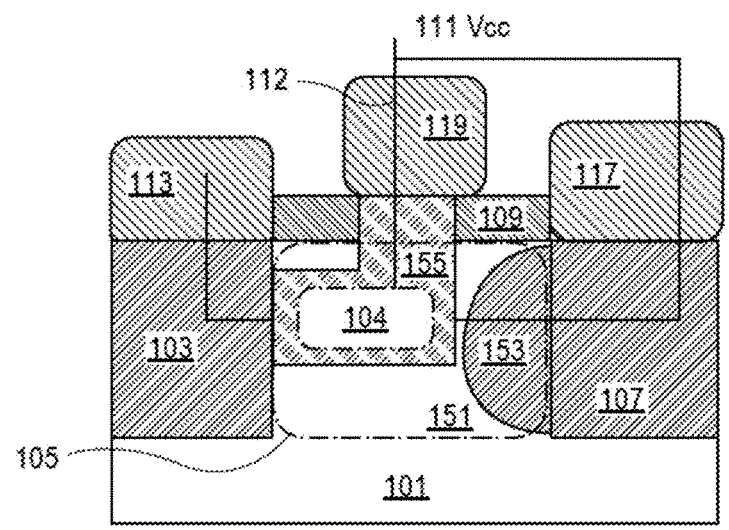

FIGS. 1(a)-1(c) schematically illustrate diagrams of a MOSFET 100 to be used as an antifuse element having a path 155 through a gate oxide layer 109 to couple a source electrode 113 and a gate electrode 119 after a programming operation is performed, in accordance with some embodiments. For clarity, features of the MOSFET 100, the path 155, the gate oxide layer 109, the source electrode 113, and the gate electrode 119 may be described below as examples for understanding an example MOSFET, a path, a gate oxide layer, a source electrode, and a gate electrode. It is to be understood that there may be more or fewer components within a MOSFET, a path, a gate oxide layer, a source electrode, and a gate electrode. Further, it is to be understood that one or more of the components within a MOSFET, a path, a gate oxide layer, a source electrode, and a gate electrode may include additional and/or varying features from the description below, and may include any device that one having ordinary skill in the art would consider and/or refer to as a MOSFET, a path, a gate oxide layer, a source electrode, and a gate electrode.

In embodiments, as shown in FIG. 1(a), the MOSFET 100 may be a PMOS MOSFET or a NMOS MOSFET. The MOSFET 100 may include a substrate 101, a source area 103 on the substrate 101, a drain area 107 on the substrate 101, a channel area 105, and the gate electrode 119. The source electrode 113 may be in contact with the source area 103, and a drain electrode 117 may be in contact with the drain area 107. The gate oxide layer 109 may be above the channel area 105, and the gate electrode 119 may be above the gate oxide layer 109.

The channel area 105 may be between the source area 103 and the drain area 107 on the substrate 101. The channel area 105 may include a first channel region 151 next to the source area 103, and a second channel region 153 next to the drain area 107. The first channel region 151 may include a dopant of a first concentration, and the second channel region 153 may include the dopant of a second concentration higher than the first concentration. For example, the first concentration of the dopant may be in a range of about 1015 cm−3 to about 1016 cm−3, while the second concentration of the dopant may be in a range of 1017 cm−3 to about 1018 cm−3. The dopant may include Silicon (Si), Germanium (Ge), Carbon (C), or Boron (B). The dopant may be distributed in a graded pattern, or uniformed distributed in the second channel region 153. In some embodiments, the second channel region 153 may take up about 20% to 40% of the area of the channel area 105, while the first channel region 151 may take up the rest of the channel area 105.

In embodiments, the substrate 101 may be a bulk substrate or a silicon-on-insulator (SOI) substrate. The source electrode 113, the gate electrode 119, or the drain electrode 117 may include germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

In embodiments, as shown in FIG. 1(b), a first resistance 102 may exist between the source electrode 113 and the gate electrode 119. The resistance 102 represented by a symbol may be a symbolic view to show a resistance, not a real physical component.

In embodiments, as shown in FIG. 1(c), when a programming voltage 111 may be applied between the source electrode 113 and the gate electrode 119 to generate a current 112 flowing between the source electrode 113 and the gate electrode 119, the path 155 may be generated through the gate oxide layer 109 to couple the source electrode 113 and the gate electrode 119. The programming voltage 111 may be less than about 2.5V between the gate electrode 119 and the source electrode 113, while the current 112 may be less than about 100 µA. The programming operation may be performed when the programming voltage 111 may be applied to the gate electrode 119, while the source electrode 113 may be coupled to a ground voltage. Furthermore, the programming voltage 111 may be applied to the drain electrode 117. When the programming voltage 111 may be applied to the drain electrode 117, hot carriers may migrate from the channel area 105, and particularly the second channel region 153 into the gate oxide layer 109 to form the path 155. The dopant of the second concentration in the second channel region 153, which is higher than the first concentration of the dopant in the first channel region 151, may increase built-in electric field near the drain area 107, and hence, may increase the hot carriers migrated to the gate oxide layer 109. The path 155 may be a permanent conductive path that exists after the programming voltage 111 is removed. A second resistance 104 may exist between the source electrode 113, the gate electrode 119, and the path 155 through the gate oxide layer 109 to couple the source electrode 113 and the gate electrode 119. The first resistance 102 may be about 102 to 106 times larger than the second resistance 104.

In embodiments, the first resistance 102 and the second resistance 104 of the MOSFET 100 may represent a digital 0 and a digital 1, or a digital 1 and a digital 0, respectively. The MOSFET 100 may be programmed to be 0 or 1, without creating a void space within the MOSFET 100. Hence, the MOSFET 100 may be more secure than a fuse element including a copper interconnect, which may leave a void space once the copper interconnect is melted after a programming voltage is applied to the fuse element. The MOSFET 100 may be used to store security keys on-die, and its stored content may not be able to be discovered by imaging inspection of the void spaces contained in the MOSFET 100.

FIGS. 2(a)-2(d) schematically illustrate diagrams of MOSFETs, e.g., a NMOS MOSFET 210, or a PMOS MOSFET 220, to be used as an antifuse element having a path through a gate oxide layer to couple a source electrode and a gate electrode, in accordance with some embodiments. In embodiments, the NMOS MOSFET 210, or the PMOS MOSFET 220 may be an example of the MOSFET 100 shown in FIG. 1.

In embodiments, the NMOS MOSFET 210 may include a gate electrode 219 above a gate oxide layer 209, a source electrode 213, a drain electrode 217, and a channel area 205 under the gate oxide layer 209, where the channel area 205 may include a first channel region 251, and a second channel region 253. The first channel region 251 may include a dopant of a first concentration, while the second channel region 253 may include the dopant of a second concentration, and the second concentration is higher than the first concentration.

As shown in FIG. 2(a), the programming operation may be performed when the programming voltage 211 may be applied to the gate electrode 219, the source electrode 213 may be coupled to a ground voltage, while a programming voltage 211 may be applied to the drain electrode 217. When the programming voltage 211 may be applied between the source electrode 213 and the gate electrode 219 to generate a current flowing between the source electrode 213 and the gate electrode 219, a path 255 may be generated through the gate oxide layer 209 to couple the source electrode 213 and the gate electrode 219.

In some other embodiments, as shown in FIG. 2(b) and FIG. 2(c), a two-step programming process may be performed to form the path 255 through the gate oxide layer 209 to couple the source electrode 213 and the gate electrode 219. As shown in FIG. 2(b), during a first step, a forming operation may be performed when the programming voltage 211 may be applied to the gate electrode 219, the source electrode 213 may be coupled to a ground voltage, while the programming voltage 211 may also be applied to the drain electrode 217. The programming voltage 211 applied to the drain electrode 217 may produce a high electric field to enhance impact-ionization avalanche and self-heating, and may render significant amounts of hot carriers into the gate oxide layer 209.

Furthermore, as shown in FIG. 2(c), during a second step, a programming operation may be performed when the source electrode 213 may be coupled to a ground voltage, and the programming voltage 211 may be applied to the gate electrode 219. The drain electrode 217 may be coupled to the ground voltage, or floating. Since a large amount of hot carriers has been created locally at the gate oxide layer 209 during the forming operation, the programming voltage 211 may be reduced at the programming operation. In addition, the time for the programming operation shown in FIG. 2(c) may be reduced as well. Other benefits may include reduced post-programming resistance at the path 255, and increased read yield.

In embodiments, as shown in FIG. 2(d), the PMOS MOSFET 220 may include a gate electrode 239 above a gate oxide layer 229, a source electrode 227, a drain electrode 223, and a channel area 225 under the gate oxide layer 229, where the channel area 225 may include a first channel region and a second channel region with dopants of two different concentrations. A programming operation may be performed when a programming voltage 231 may be applied to the source electrode 227, while the gate electrode 239 and the drain electrode 223 may be coupled to a ground voltage. A current may flow between the source electrode 227 and the gate electrode 239, and a path 275 may be generated through the gate oxide layer 229 to couple the source electrode 227 and the gate electrode 239.

The path 255 may change a resistance between the gate electrode 219 and the source electrode 213. Similarly, the path 275 may change a resistance between the gate electrode 239 and the source electrode 227. A sensor amplifier, not shown, may detect the resistance between the gate electrode 219 and the source electrode 213, or the resistance between the gate electrode 239 and the source electrode 227, and compare the detected resistance to a reference element to determine a digital value represented by the MOSFET 210 or the PMOS MOSFET 220. The operations performed by the sensor amplifier to detect the resistance and determine the digital value may be referred to as a sensing operation.

Figure 3B:
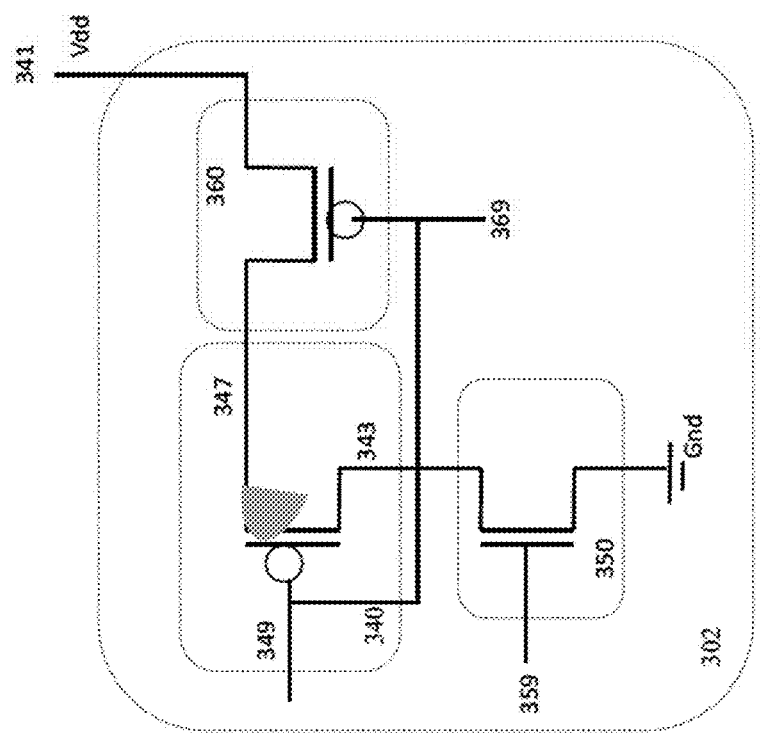
FIGS. 3(a)-3(b) schematically illustrate diagrams of MOSFETs coupled with selectors to be used as an antifuse cell, in accordance with some embodiments.
Figure 3A:
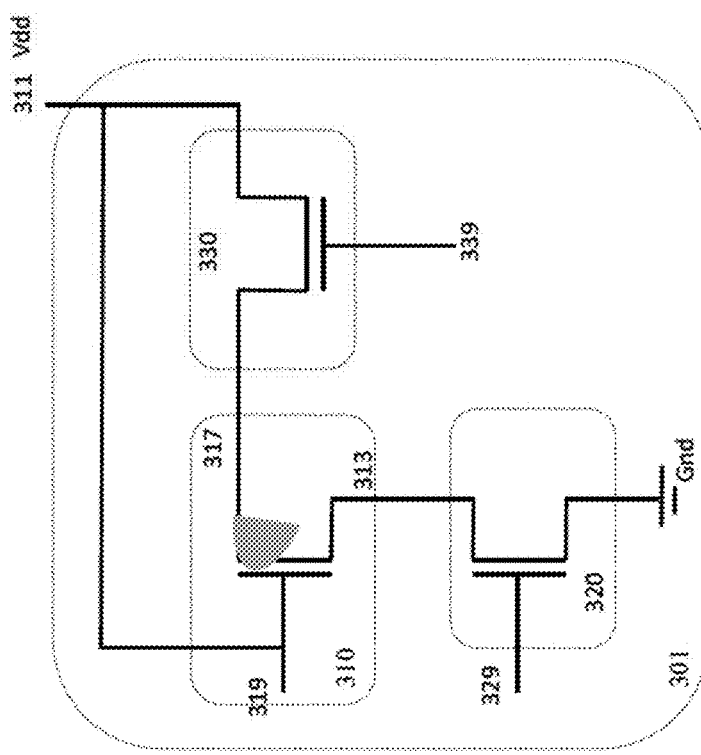

FIGS. 3(a)-3(b) schematically illustrate diagrams of MOSFETs, e.g., a NMOS MOSFET 310, or a PMOS MOSFET 340, coupled with selectors to be used as an antifuse cell, e.g., an antifuse cell 301, or an antifuse cell 302, in accordance with some embodiments. In embodiments, the NMOS MOSFET 310, or the PMOS MOSFET 340, may be an example of the MOSFET 100 shown in FIG. 1.

In embodiments, as shown in FIG. 3(a), the antifuse cell 301 may include the NMOS MOSFET 310 coupled with a first selector 320 and a second selector 330. The NMOS MOSFET 310 may include a gate electrode 319, a source electrode 313, and a drain electrode 317. The NMOS MOSFET 310 may be used as an antifuse element. A programming operation may be performed when a programming voltage 311 may be applied to the gate electrode 319, the source electrode 313 may be coupled to a ground voltage through the first selector 320, while a programming voltage 311 may be applied to the drain electrode 317 through the second selector 330. In embodiments, the first selector 320 or the second selector 330 may be a NMOS transistor. The first selector 320 may be a NMOS transistor with a gate electrode 329 to control the access to the ground for the source electrode 313. The second selector 330 may be a NMOS transistor or a PMOS transistor with a gate electrode 339 to control the access to the programming voltage 311 for the drain electrode 317.

In embodiments, as shown in FIG. 3(b), the antifuse cell 302 may include the PMOS MOSFET 340 coupled with a first selector 350 and a second selector 360. The PMOS MOSFET 340 may include a gate electrode 349, a drain electrode 343, and a source electrode 347. The PMOS MOSFET 340 may be used as an antifuse element. A programming operation may be performed when a programming voltage 341 may be applied to the gate electrode 349, the drain electrode 343 may be coupled to a ground voltage through the first selector 350, while the programming voltage 341 may be applied to the source electrode 347 through the second selector 360. In embodiments, the first selector 350 or the second selector 360 may be a NMOS transistor or a PMOS transistor. The first selector 350 may be a NMOS transistor with a gate electrode 359 to control the access to the ground for the drain electrode 343. The second selector 360 may be a PMOS transistor with a gate electrode 369 to control the access to the programming voltage 341 for the source electrode 347.

Figure 4:
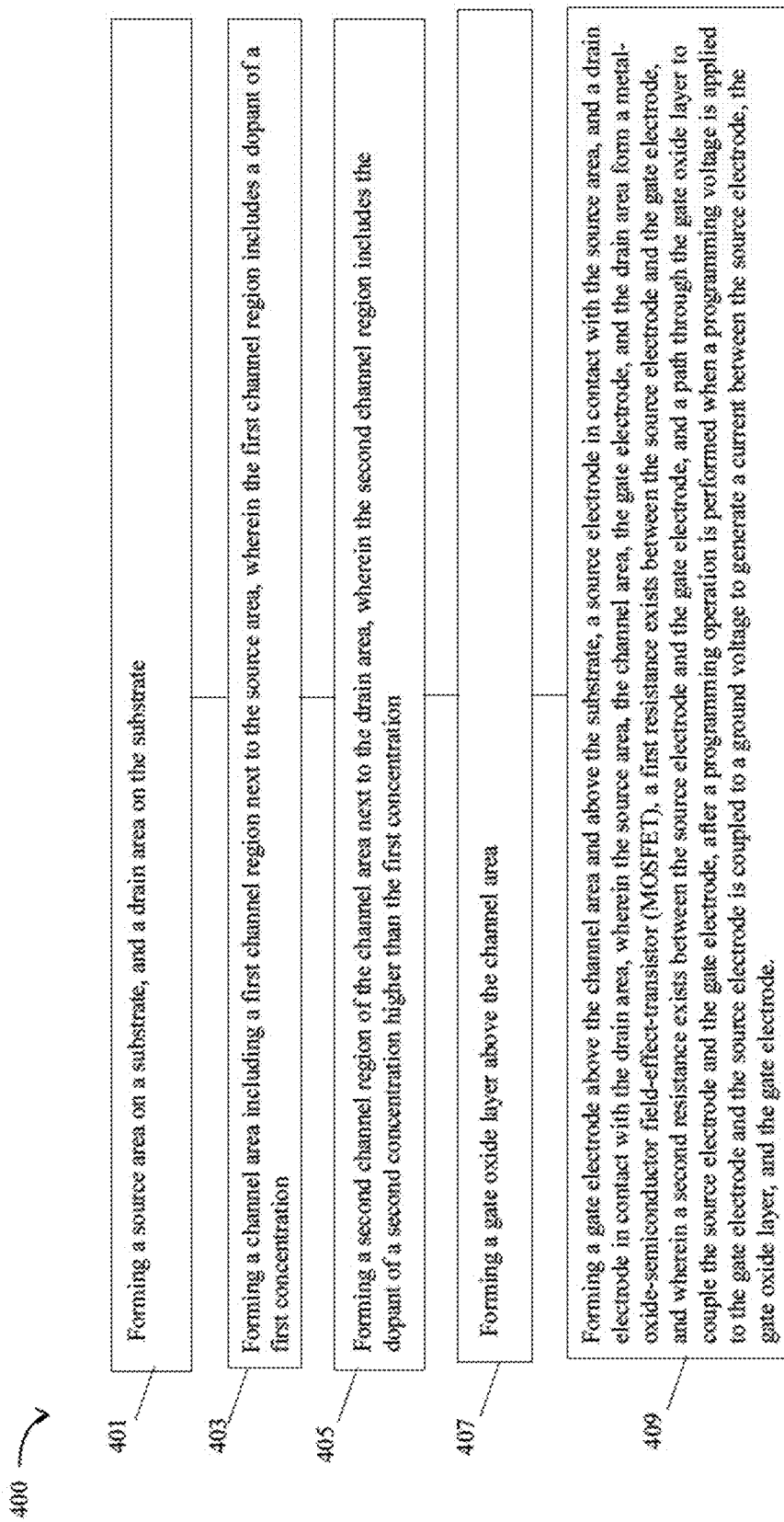
FIG. 4 schematically illustrates a process 400 for forming a MOSFET to be used as an antifuse element having a path through a gate oxide layer to couple a source electrode and a gate electrode after a programming operation is performed, in accordance with some embodiments.

FIG. 4 schematically illustrates a process 400 for forming a MOSFET to be used as an antifuse element having a path through a gate oxide layer to couple a source electrode and a gate electrode after a programming operation is performed, in accordance with some embodiments. In embodiments, the process 400 may be applied to form the MOSFET 100 in FIG. 1, the MOSFET 210, the MOSFET 220, in FIG. 2, the MOSFET 310, or the MOSFET 340 in FIG. 3.

At block 401, the process 400 may include forming a source area on a substrate, and a drain area on the substrate. For example, the process 400 may include forming the source area 103 on the substrate 101, and the drain area 107 on the substrate 101, as shown in FIG. 1.

At block 403, the process 400 may include forming a channel area including a first channel region next to the source area, wherein the first channel region includes a dopant of a first concentration. For example, the process 400 may include forming the channel area 105 including the first channel region 151 next to the source area 103, wherein the first channel region 151 includes a dopant of a first concentration, as shown in FIG. 1.

At block 405, the process 400 may include forming a second channel region of the channel area next to the drain area, wherein the second channel region includes the dopant of a second concentration higher than the first concentration. For example, the process 400 may include forming the second channel region 153 of the channel area 105 next to the drain area 107. The second channel region 153 may include the dopant of a second concentration higher than the first concentration, as shown in FIG. 1.

At block 407, the process 400 may include forming a gate oxide layer above the channel area. For example, the process 400 may include forming the gate oxide layer 109 above the channel area 105.

At block 409, the process 400 may include forming a gate electrode above the channel area and above the substrate, a source electrode in contact with the source area, and a drain electrode in contact with the drain area. The source area, the channel area, the gate electrode, and the drain area may form a MOSFET. A first resistance may exist between the source electrode and the gate electrode. A programming operation may be performed when a programming voltage is applied to the gate electrode and the source electrode is coupled to a ground voltage to generate a current between the source electrode, the gate oxide layer, and the gate electrode. After the programming operation, a path may be generated through the gate oxide layer to couple the source electrode and the gate electrode. A second resistance may exist between the source electrode and the gate electrode through the path through the gate oxide layer to couple the source electrode and the gate electrode. For example, the process 400 may include forming the gate electrode 119 above the channel area 105 and above the substrate 101, the source electrode 113 in contact with the source area 103, and the drain electrode 117 in contact with the drain area 107. The source area 103, the channel area 105, the gate electrode 119, and the drain area 107 may form the MOSFET 100. The first resistance 102 may exist between the source electrode 113 and the gate electrode 119. After a programming operation, the path 155 may be generated through the gate oxide layer 109 to couple the source electrode 113 and the gate electrode 119. The second resistance 104 may exist between the source electrode 113 and the gate electrode 119 through the path 155 through the gate oxide layer 109 to couple the source electrode 113 and the gate electrode 119.

In addition, the process 400 may include additional operations to form other layers, e.g., ILD layers, or encapsulation layers, insulation layers, not shown. In some embodiments, the various blocks, e.g., the block 401, the block 403, the block 405, the block 407, and the block 409 may not be ordered as shown in FIG. 4. Various blocks of the process 400 may be performed in an order different from the one shown in FIG. 4.

Figure 5:
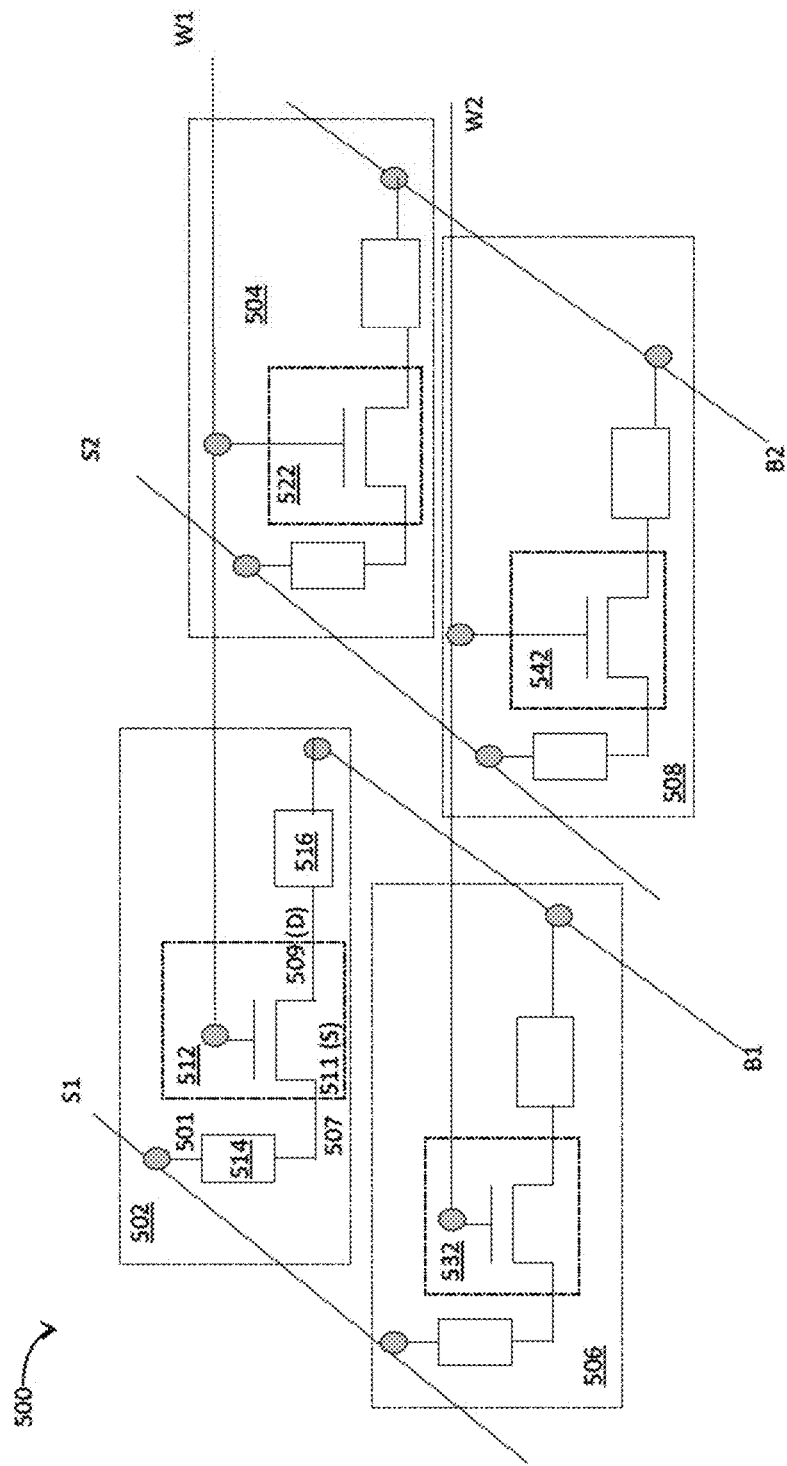
FIG. 5 schematically illustrates an antifuse memory array with multiple antifuse cells, where an antifuse cell includes an antifuse element having a MOSFET with a path through a gate oxide layer to couple a source electrode and a gate electrode after a programming operation is performed, in accordance with some embodiments.

FIG. 5 schematically illustrates an antifuse memory array 500 with multiple antifuse cells, e.g., an antifuse cell 502, an antifuse cell 504, an antifuse cell 506, and an antifuse cell 508, where an antifuse cell may include an antifuse element having a MOSFET to be used as an antifuse element having a path through a gate oxide layer to couple a source electrode and a gate electrode after a programming operation is performed, in accordance with some embodiments. For example, the antifuse cell 502, the antifuse cell 504, the antifuse cell 506, or the antifuse cell 508 may be an example of the antifuse cell 301 or the antifuse cell 302 in FIG. 3. The antifuse cell 502 includes an antifuse element 512, the antifuse cell 504 includes an antifuse element 522, the antifuse cell 506 includes an antifuse element 532, and the antifuse cell 508 includes an antifuse element 542. In embodiments, the antifuse element 512, the antifuse element 522, the antifuse element 532, and the antifuse element 542 may be similar to the MOSFET 100 in FIG. 1, the MOSFET 210, the MOSFET 220, in FIG. 2, the MOSFET 310, or the MOSFET 340 in FIG. 3, or a MOSFET to be used as an antifuse element formed following the process 400. In embodiments, the multiple antifuse cells may be arranged in a number of rows and columns coupled by bit lines, e.g., bit line B1 and bit line B2, source lines, e.g., source line S1, and source line S2, word lines, e.g., word line W1 and word line W2.

In embodiments, the multiple antifuse cells may be arranged in a number of rows and columns coupled by bit lines, e.g., bit line B1 and bit line B2, word lines, e.g., word line W1 and word line W2, and source lines, e.g., source line S1 and source line S2. The antifuse cell 502 may be coupled in parallel with the other antifuse cells of the same row, and may be coupled in parallel with the antifuse cells of the other rows. The antifuse memory array 500 may include any suitable number of one or more antifuse cells. Although the antifuse memory array 500 is shown in FIG. 5 with two rows that each includes two antifuse cells coupled in parallel, other embodiments may include other numbers of rows and/or numbers of antifuse cells within a row. In some embodiments, the number of rows may be different from the number of columns in an antifuse memory array. Each row of the antifuse memory array may have a same number of antifuse cells. Additionally, or alternatively, different rows may have different numbers of antifuse cells.

In embodiments, multiple antifuse cells, such as the antifuse cell 502, the antifuse cell 504, the antifuse cell 506, and the antifuse cell 508, may have a similar configuration, such as a MOSFET coupled to two selectors. For example, the antifuse cell 502 may include a selector 514 and a selector 516 coupled to antifuse element 512 that may be a MOSFET. An antifuse cell, e.g., the antifuse cell 502, may be controlled through multiple electrical connections to read from the antifuse cells, write to the antifuse cells, and/or perform other memory operations.

In embodiments, when the antifuse element 512 is a MOSFET, the antifuse element 512 may be changed from one resistance to another resistance between a source electrode 511 and a gate electrode 512, which may be used to represent the two values of a bit, conventionally called 0 and 1. The antifuse element 512 may be individually controllable by the selector 514 and the selector 516, which may function as demonstrated in FIG. 3 for the antifuse cell 301 or the antifuse cell 302.

The bit line B1 of the antifuse memory array 500 may be coupled to a gate electrode of the selector 516. When the bit line B1 is active, the selector 516 may select the antifuse element 512. The source line S1 of the antifuse memory array 500 may be coupled to an electrode 501 of the selector 514. In addition, a word line W1 of the antifuse memory array 500 may be coupled to another electrode of the antifuse element 512. In embodiments, the antifuse element 512 may be individually controllable by the selector 514 to switch between a first state and a second state. When the bit line B1 is active, the selector 516 may select the antifuse element 512. A signal from the source line S1 may pass through the selector 514, further through the antifuse element 512, and reaching the other electrode, which is the bit line B1.

Figure 6:
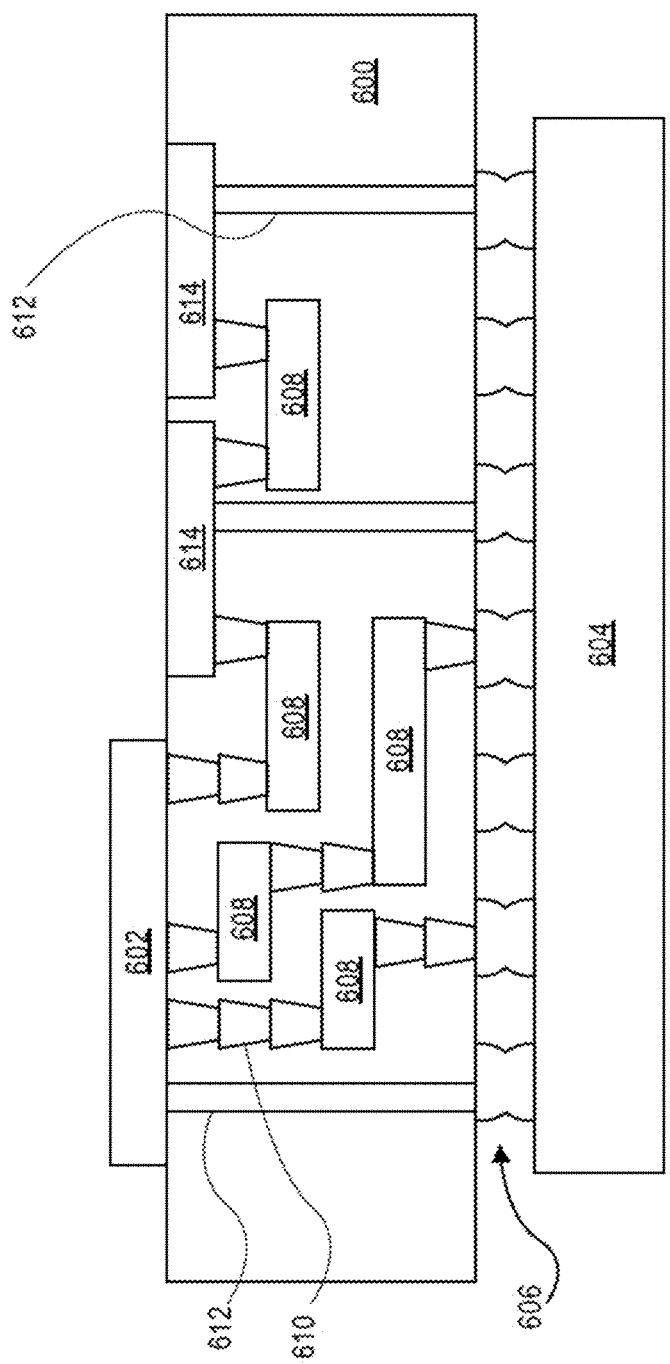
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 may be an intervening substrate used to bridge a first substrate 602 to a second substrate 604. The first substrate 602 may be, for instance, a substrate support for a MOSFET to be used as an antifuse element, e.g., the MOSFET 100 in FIG. 1, the MOSFET 210, the MOSFET 220, in FIG. 2, the MOSFET 310, or the MOSFET 340 in FIG. 3, or a MOSFET to be used as an antifuse element formed following the process 400. The second substrate 604 may be, for instance, a memory module, a computer motherboard, or another integrated circuit die. For example, the second substrate 604 may be a memory module including the antifuse memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. In further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, antifuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
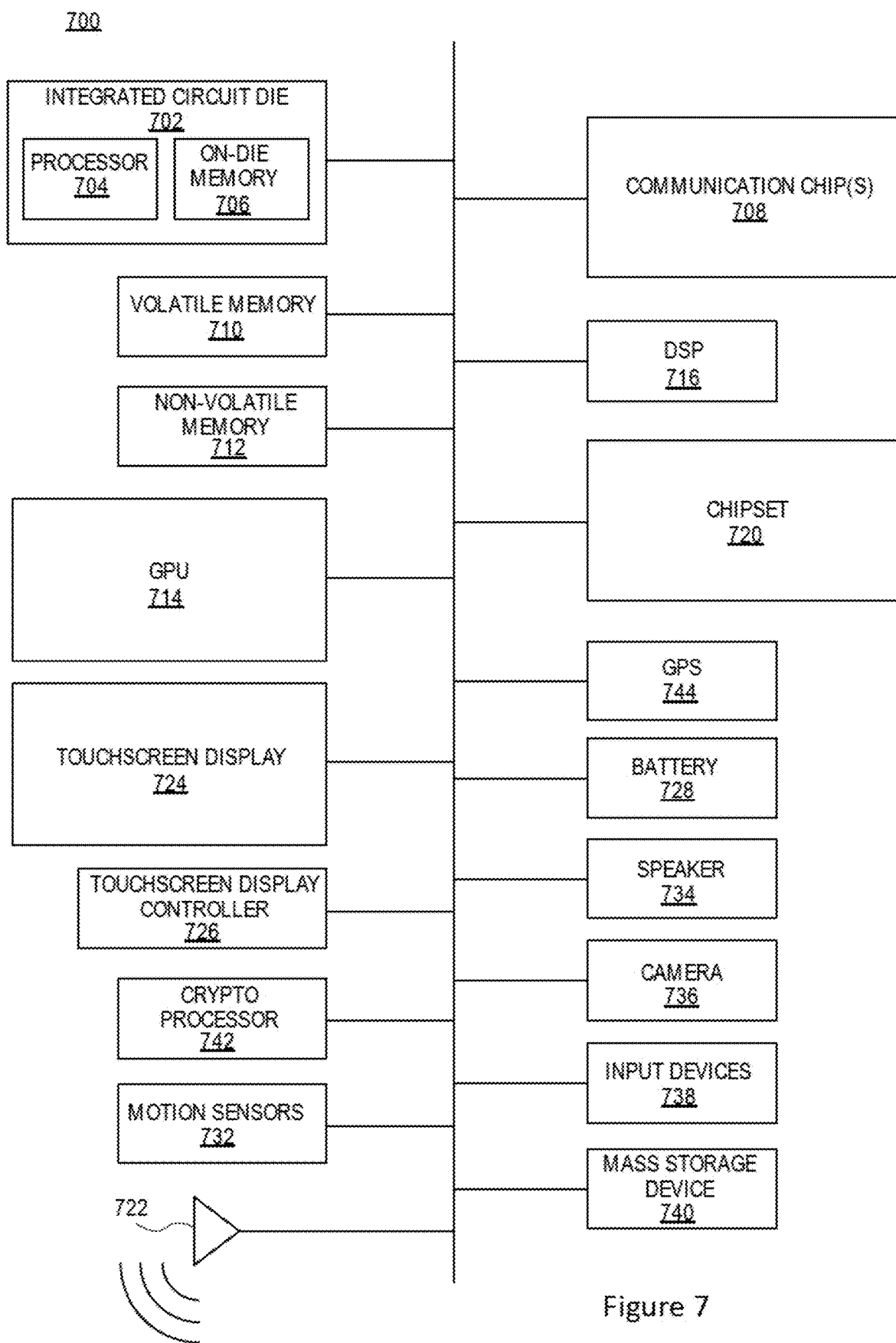
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include a MOSFET to be used as an antifuse element, e.g., the MOSFET 100 in FIG. 1, the MOSFET 210, the MOSFET 220, in FIG. 2, the MOSFET 310, or the MOSFET 340 in FIG. 3, a MOSFET to be used as an antifuse element formed following the process 400, or the antifuse memory array 500 shown in FIG. 5.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as an antifuse memory array or antifuse elements, which are formed in accordance with implementations of the current disclosure, e.g., the MOSFET 100 in FIG. 1, the MOSFET 210, the MOSFET 220, in FIG. 2, the MOSFET 310, or the MOSFET 340 in FIG. 3, or a MOSFET to be used as an antifuse element formed following the process 400, or the antifuse memory array 500 shown in FIG. 5.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include an integrated circuit (IC), comprising: a source electrode in contact with a source area on a substrate; a drain electrode in contact with a drain area on the substrate; a channel area including a first channel region next to the source area, and a second channel region next to the drain area, wherein the first channel region includes a dopant of a first concentration, and the second channel region includes the dopant of a second concentration higher than the first concentration; a gate oxide layer above the channel area; and a gate electrode above the gate oxide layer; wherein the source area, the channel area, the gate electrode, and the drain area form a metal-oxide-semiconductor field-effect-transistor (MOSFET), a first resistance exists between the source electrode and the gate electrode, and wherein a second resistance exists between the source electrode and the gate electrode, and a path through the gate oxide layer to couple the source electrode and the gate electrode, after a programming operation is performed when a programming voltage is applied to the gate electrode and the source electrode is coupled to a ground voltage to generate a current between the source electrode, the gate oxide layer, and the gate electrode.

Example 2 may include the integrated circuit of example 1 and/or some other examples herein, wherein the programming operation is performed after a forming operation has been performed, and wherein when the forming operation is performed, the programming voltage is applied to the gate electrode and the drain electrode, and the source electrode is coupled to the ground voltage.

Example 3 may include the integrated circuit of example 1 and/or some other examples herein, wherein the programming operation is performed when the programming voltage is applied to the drain electrode.

Example 4 may include the integrated circuit of example 1 and/or some other examples herein, wherein the substrate is a bulk substrate or a silicon-on-insulator (SOI) substrate.

Example 5 may include the integrated circuit of example 1 and/or some other examples herein, wherein the MOSFET is a PMOS MOSFET or a NMOS MOSFET.

Example 6 may include the integrated circuit of example 1 and/or some other examples herein, wherein the programming voltage is less than about 2.5V between the gate electrode and the source electrode.

Example 7 may include the integrated circuit of example 1 and/or some other examples herein, wherein the current is less than about 100 µA.

Example 8 may include the integrated circuit of example 1 and/or some other examples herein, wherein the first resistance is about 102 to 106 times larger than the second resistance.

Example 9 may include the integrated circuit of example 1 and/or some other examples herein, wherein the first concentration of the dopant is in a range of about 1015 cm−3 to about 1016 cm−3, and the second concentration of the dopant is in a range of 1017 cm−3 to about 1018 cm−3.

Example 10 may include the integrated circuit of example 1 and/or some other examples herein, wherein the dopant includes Silicon (Si), Germanium (Ge), Carbon (C), or Boron (B).

Example 11 may include the integrated circuit of example 1 and/or some other examples herein, wherein the dopant is distributed in a graded pattern, or uniformed distributed in the second channel region.

Example 12 may include the integrated circuit of example 1 and/or some other examples herein, wherein the source electrode, the drain electrode, or the gate electrode includes polycrystalline silicon (poly-Si), polycrystalline silicon-germanium, germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 13 may include the integrated circuit of example 1 and/or some other examples herein, further comprising: a first selector coupled to the drain electrode; and a second selector coupled to the source electrode.

Example 14 may include the integrated circuit of example 13 and/or some other examples herein, wherein the first selector or the second selector is a PMOS transistor or a NMOS transistor.

Example 15 may include a method for forming an integrated circuit, the method comprising: forming a source area on a substrate, and a drain area on the substrate; forming a channel area including a first channel region next to the source area, wherein the first channel region includes a dopant of a first concentration; forming a second channel region of the channel area next to the drain area, wherein the second channel region includes the dopant of a second concentration higher than the first concentration; forming a gate oxide layer above the channel area; and forming a gate electrode above the channel area and above the substrate, a source electrode in contact with the source area, and a drain electrode in contact with the drain area, wherein the source area, the channel area, the gate electrode, and the drain area form a metal-oxide-semiconductor field-effect-transistor (MOSFET), a first resistance exists between the source electrode and the gate electrode, and wherein a second resistance exists between the source electrode and the gate electrode, and a path through the gate oxide layer to couple the source electrode and the gate electrode, after a programming operation is performed when a programming voltage is applied to the gate electrode and the source electrode is coupled to a ground voltage to generate a current between the source electrode, the gate oxide layer, and the gate electrode.

Example 16 may include the method of example 15 and/or some other examples herein, wherein the programming operation is performed after a forming operation has been performed, and wherein when the forming operation is performed, the programming voltage is applied to the gate electrode and the drain electrode, and the source electrode is coupled to the ground voltage.

Example 17 may include the method of example 15 and/or some other examples herein, wherein the programming voltage is less than about 2.5V between the gate electrode and the source electrode.

Example 18 may include the method of example 15 and/or some other examples herein, wherein the first concentration of the dopant is in a range of about $10^{15}$ cm$^{-3}$ to about $10^{16}$ cm$^{-3}$, and the second concentration of the dopant is in a range of $10^{17}$ cm$^{-3}$ to about $10^{18}$ cm$^{-3}$.

Example 19 may include the method of example 15 and/or some other examples herein, wherein the dopant includes Si, Ge, C, or Boron.

Example 20 may include the method of example 15 and/or some other examples herein, wherein the first resistance is about $10^2$ to $10^6$ times larger than the second resistance.

Example 21 may include a computing device, comprising: a circuit board; and an antifuse memory array coupled to the circuit board, wherein the antifuse memory array includes a plurality of antifuse cells, an antifuse cell of the plurality of antifuse cells includes an antifuse element coupled to a first selector and a second selector, and wherein the antifuse element includes: a source electrode in contact with a source area on a substrate and coupled to a source line of the antifuse memory array through the first selector; a drain electrode in contact with a drain area on the substrate and coupled to a word line of the antifuse memory array through the second selector; a channel area including a first channel region next to the source area, and a second channel region next to the drain area, wherein the first channel region includes a dopant of a first concentration, and the second channel region includes the dopant of a second concentration higher than the first concentration; a gate oxide layer above the channel area; and a gate electrode above the gate oxide layer and coupled to a bit line of the antifuse memory array; wherein the source area, the channel area, the gate electrode, and the drain area form a metal-oxide-semiconductor field-effect-transistor (MOSFET), a first resistance exists between the source electrode and the gate electrode, and wherein a second resistance exists between the source electrode and the gate electrode, and a path through the gate oxide layer to couple the source electrode and the gate electrode, after a programming operation is performed when a programming voltage is applied to the gate electrode and the source electrode is coupled to a ground voltage to generate a current between the source electrode, the gate oxide layer, and the gate electrode.

Example 22 may include the computing device of example 21 and/or some other examples herein, wherein the first selector or the second selector is a NMOS transistor or a PMOS transistor.

Example 23 may include the computing device of example 21 and/or some other examples herein, wherein the first concentration of the dopant is in a range of about $10^{15}$ cm$^{-3}$ to about $10^{16}$ cm$^{-3}$, and the second concentration of the dopant is in a range of $10^{17}$ cm$^{-3}$ to about $10^{18}$ cm$^{-3}$.

Example 24 may include the computing device of example 21 and/or some other examples herein, wherein the programming voltage is less than about 2.5V between the gate electrode and the source electrode.

Example 25 may include the computing device of example 21 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
  a source electrode in contact with a source area on a substrate;
  a drain electrode in contact with a drain area on the substrate;
  a channel area including a first channel region next to the source area, and a second channel region next to the drain area, wherein the first channel region includes a dopant of a first concentration, and the second channel region includes the dopant of a second concentration higher than the first concentration;
  a gate oxide layer above the channel area; and a gate electrode above the gate oxide layer;
wherein the source area, the channel area, the gate electrode, and the drain area form a metal-oxide-semiconductor field-effect-transistor (MOSFET), a first resistance exists between the source electrode and the gate electrode, and wherein a second resistance exists between the source electrode and the gate electrode, and a path through the gate oxide layer to couple the source electrode and the gate electrode, after a programming operation is performed when a programming voltage is applied to the gate electrode and the source electrode is coupled to a ground voltage to generate a current between the source electrode, the gate oxide layer, and the gate electrode.

2. The integrated circuit of claim 1, wherein the programming operation is performed after a forming operation has been performed, and wherein when the forming operation is performed, the programming voltage is applied to the gate electrode and the drain electrode, and the source electrode is coupled to the ground voltage.

3. The integrated circuit of claim 1, wherein the programming operation is performed when the programming voltage is applied to the drain electrode.

4. The integrated circuit of claim 1, wherein the substrate is a bulk substrate or a silicon-on-insulator (SOI) substrate.

5. The integrated circuit of claim 1, wherein the MOSFET is a PMOS MOSFET or a NMOS MOSFET.

6. The integrated circuit of claim 1, wherein the programming voltage is less than about 2.5V between the gate electrode and the source electrode.

7. The integrated circuit of claim 1, wherein the current is less than about 100 µA.

8. The integrated circuit of claim 1, wherein the first resistance is about $10^2$ to $10^6$ times larger than the second resistance.

9. The integrated circuit of claim 1, wherein the first concentration of the dopant is in a range of about $10^{15}$ cm$^{-3}$ to about $10^{16}$ cm$^{-3}$, and the second concentration of the dopant is in a range of $10^{17}$ cm$^{-3}$ to about $10^{18}$ cm$^{-3}$.

10. The integrated circuit of claim 1, wherein the dopant includes Silicon (Si), Germanium (Ge), Carbon (C), or Boron (B).

11. The integrated circuit of claim 1, wherein the dopant is distributed in a graded pattern, or uniformed distributed in the second channel region.

12. The integrated circuit of claim 1, wherein the source electrode, the drain electrode, or the gate electrode includes polycrystalline silicon (poly-Si), polycrystalline silicon-germanium, germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

13. The integrated circuit of claim 1, further comprising:
a first selector coupled to the drain electrode; and
a second selector coupled to the source electrode.

14. The integrated circuit of claim 13, wherein the first selector or the second selector is a PMOS transistor or a NMOS transistor.

15. A method for forming an integrated circuit, the method comprising:
forming a source area on a substrate, and a drain area on the substrate;
forming a channel area including a first channel region next to the source area, wherein the first channel region includes a dopant of a first concentration;
forming a second channel region of the channel area next to the drain area, wherein the second channel region includes the dopant of a second concentration higher than the first concentration;
forming a gate oxide layer above the channel area; and
forming a gate electrode above the channel area and above the substrate, a source electrode in contact with the source area, and a drain electrode in contact with the drain area, wherein the source area, the channel area, the gate electrode, and the drain area form a metal-oxide-semiconductor field-effect-transistor (MOSFET), a first resistance exists between the source electrode and the gate electrode, and wherein a second resistance exists between the source electrode and the gate electrode, and a path through the gate oxide layer to couple the source electrode and the gate electrode, after a programming operation is performed when a programming voltage is applied to the gate electrode and the source electrode is coupled to a ground voltage to generate a current between the source electrode, the gate oxide layer, and the gate electrode.

16. The method of claim 15, wherein the programming operation is performed after a forming operation has been performed, and wherein when the forming operation is performed, the programming voltage is applied to the gate electrode and the drain electrode, and the source electrode is coupled to the ground voltage.

17. The method of claim 15, wherein the programming voltage is less than about 2.5V between the gate electrode and the source electrode.

18. The method of claim 15, wherein the first concentration of the dopant is in a range of about $10^{15}$ cm$^{-3}$ to about $10^{16}$ cm$^{-3}$, and the second concentration of the dopant is in a range of $10^{17}$ cm$^{-3}$ to about $10^{18}$ cm$^{-3}$.

19. The method of claim 15, wherein the dopant includes Si, Ge, C, or Boron.

20. The method of claim 15, wherein the first resistance is about $10^2$ to $10^6$ times larger than the second resistance.

21. A computing device, comprising:
a circuit board; and
an antifuse memory array coupled to the circuit board, wherein the antifuse memory array includes a plurality of antifuse cells, an antifuse cell of the plurality of antifuse cells includes an antifuse element coupled to a first selector and a second selector, and wherein the antifuse element includes:
a source electrode in contact with a source area on a substrate and coupled to a source line of the antifuse memory array through the first selector;
a drain electrode in contact with a drain area on the substrate and coupled to a word line of the antifuse memory array through the second selector;
a channel area including a first channel region next to the source area, and a second channel region next to the drain area, wherein the first channel region includes a dopant of a first concentration, and the second channel region includes the dopant of a second concentration higher than the first concentration;
a gate oxide layer above the channel area; and
a gate electrode above the gate oxide layer and coupled to a bit line of the antifuse memory array;
wherein the source area, the channel area, the gate electrode, and the drain area form a metal-oxide-semiconductor field-effect-transistor (MOSFET), a first resistance exists between the source electrode and the gate electrode, and wherein a second resistance exists between the source electrode and the gate electrode, and a path through the gate oxide layer to couple the source electrode and the gate electrode, after a programming operation is performed when a programming voltage is applied to the gate electrode and the source electrode is coupled to a ground voltage to generate a current between the source electrode, the gate oxide layer, and the gate electrode.

22. The computing device of claim 21, wherein the first selector or the second selector is a NMOS transistor or a PMOS transistor.

23. The computing device of claim 21, wherein the first concentration of the dopant is in a range of about $10^{15}$ $cm^{-3}$ to about $10^{16}$ $cm^{-3}$, and the second concentration of the dopant is in a range of $10^{17}$ $cm^{-3}$ to about $10^{18}$ $cm^{-3}$.

24. The computing device of claim 21, wherein the programming voltage is less than about 2.5V between the gate electrode and the source electrode.

25. The computing device of claim 21, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

* * * * *